US 11,737,271 B2

(12) United States Patent
Kwon et al.

(10) Patent No.: US 11,737,271 B2
(45) Date of Patent: Aug. 22, 2023

(54) SEMICONDUCTOR MEMORY DEVICE WITH A PLURALITY OF AMPLIFICATION STAGES

(71) Applicant: SAMSUNG ELECTRONICS CO., LTD., Suwon-si (KR)

(72) Inventors: Tae-Hong Kwon, Seoul (KR); Chan Ho Kim, Seoul (KR); Kyung Hwa Yun, Hwaseong-si (KR); Dae Seok Byeon, Seongnam-si (KR); Chi Weon Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 317 days.

(21) Appl. No.: 16/993,570

(22) Filed: Aug. 14, 2020

(65) Prior Publication Data

US 2021/0193679 A1 Jun. 24, 2021

(30) Foreign Application Priority Data

Dec. 18, 2019 (KR) ........................ 10-2019-0169839

(51) Int. Cl.
| | | |
|---|---|---|
| *H10B 43/27* | (2023.01) | |
| *G11C 16/32* | (2006.01) | |
| *G11C 16/08* | (2006.01) | |
| *G11C 16/24* | (2006.01) | |
| *G11C 5/14* | (2006.01) | |
| *H10B 43/35* | (2023.01) | |
| *H10B 43/40* | (2023.01) | |

(52) U.S. Cl.
CPC ............ *H10B 43/27* (2023.02); *G11C 5/145* (2013.01); *G11C 16/08* (2013.01); *G11C 16/24* (2013.01); *G11C 16/32* (2013.01); *H10B 43/35* (2023.02); *H10B 43/40* (2023.02)

(58) Field of Classification Search
CPC .......... H01L 27/11582; H01L 27/1157; H01L 27/11573; H01L 27/0805; G11C 5/145; G11C 16/08; G11C 16/24; G11C 16/32; G11C 16/30; G11C 16/0483; G11C 5/063; G11C 5/147; G11C 5/06; H10B 43/27; H10B 43/35; H10B 43/40
See application file for complete search history.

(56) References Cited

U.S. PATENT DOCUMENTS

| | | |
|---|---|---|
| 7,619,945 B2 | 11/2009 | Norman |
| 7,749,855 B2 | 7/2010 | Yang et al. |
| 8,531,901 B2 | 9/2013 | Ogiwara et al. |
| 8,780,636 B2 | 7/2014 | Maejima |
| 9,142,291 B2 | 9/2015 | Park |
| 9,177,611 B2 | 11/2015 | D'Abreu et al. |

(Continued)

FOREIGN PATENT DOCUMENTS

KR    1020140028905 A    3/2014

*Primary Examiner* — Jerome Leboeuf
(74) *Attorney, Agent, or Firm* — Sughrue Mion, PLLC

(57) ABSTRACT

In order to permit dense integration of a high number of stacked word lines in the semiconductor memory device, a charge pump is included in the semiconductor memory device. The charge pump makes use of a capacitor. The capacitor is implemented with respect to the dense integration. Some components are placed under the stacked word lines, and some are not under the stacked word lines. The capacity of the capacitor not under the stacked word lines is provided in part by a parallel structure.

17 Claims, 17 Drawing Sheets

(56) References Cited

U.S. PATENT DOCUMENTS

| | | | |
|---|---|---|---|
| 2017/0047343 A1* | 2/2017 | Lee | H01L 27/11573 |
| 2019/0027226 A1* | 1/2019 | Hioka | G11C 16/0483 |
| 2019/0165673 A1* | 5/2019 | Otsuka | H02M 3/073 |
| 2019/0214098 A1* | 7/2019 | Arakawa | G11C 16/26 |
| 2020/0194452 A1* | 6/2020 | Xiao | H01L 27/11582 |
| 2021/0065823 A1* | 3/2021 | Endo | G11C 11/5642 |

\* cited by examiner

SEMICONDUCTOR MEMORY DEVICE WITH A PLURALITY OF AMPLIFICATION STAGES

This application claims the benefit of Korean Patent Application No. 10-2019-0169839, filed on Dec. 18, 2019, in the Korean Intellectual Property Office, the disclosure of which is incorporated herein in its entirety by reference.

BACKGROUND

1. Field

The present disclosure relates to a semiconductor memory device.

2. Description of the Related Art

To improve the degree of integration of a memory device having a multi-layered structure, the number of layers of word lines stacked vertically in the memory device is being increased. To operate a highly stacked memory device, a Charge pump that provides a high current to simultaneously apply a constant operating voltage to a plurality of word lines is required. As the number of layers of word lines stacked increases, the size of the charge pump also increases. In addition, when the charge pump is buried under a memory cell array in the memory device, not all elements of the charge pump can be buried under the memory cell array. Since some elements of the charge pump cannot be buried under the memory cell array, the chip size of the memory device increases.

SUMMARY

Aspects of the present disclosure provide a semiconductor memory device including a capacitor which is disposed in an amplification stage not buried under a memory cell array and has high area efficiency.

Aspects of the present disclosure also provide a semiconductor memory device including a charge pump in which some amplification stages are driven at a high frequency.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

Provided herein is a semiconductor memory device including: a substrate including a first region and a second region; first lower wirings disposed in the first region of the substrate; second lower wirings disposed in the second region of the substrate; a stacked structure, wherein the stacked structure is disposed on the first lower wirings, and the stacked structure includes an interlayer insulating film and an electrode pad alternately stacked in a direction perpendicular to the substrate; a vertical structure penetrating the stacked structure; a tunnel insulating layer extending along sidewalk of the vertical structure; a charge storage layer extending along sidewalls of the tunnel insulating layer; a plurality of through rias disposed on the second lower wirings, wherein the plurality of through vias are configured to electrically connect the second lower wirings and upper wirings disposed of the second region; a first amplification stage including the first lower wirings and configured to generate a first operating voltage to be applied to the electrode pad; and a second amplification stage including the second lower wirings and the plurality of through vias, electrically connected to the first amplification stage, and configured to generate a second operating voltage to be applied to the electrode pad.

Also provided is a semiconductor memory device including: a memory cell array electrically connected to a plurality of word lines and electrically connected to a plurality of bit lines, wherein the memory cell array includes a plurality of memory cells stacked vertically with respect to a substrate; and a charge pump configured to generate an operating voltage to be applied to the plurality of word lines so as to operate the plurality of memory cells, wherein the charge pump includes a first amplification stage and a second amplification stage, the first and second amplification stages configured to generate the operating voltage, the first amplification stage is driven by a first regulator, the first regulator is configured to generate a first clock signal, the second amplification stage is driven by a second regulator, the second regulator is configured to generate a second clock signal having a second frequency faster than a first frequency of the first clock signal, the first amplification stage is disposed under and vertically overlapped by the memory cell array, and the second amplification stage is disposed under but is not vertically overlapped by the memory cell array.

Also provided is yet another semiconductor memory device including: a memory cell array electrically connected to a plurality of word lines and electrically connected to a plurality of bit lines, the memory cell array including a plurality of memory cells stacked vertically from a substrate, wherein the plurality of memory cells comprise a first plane memory cell and a second plane memory cell disposed on the substrate not to vertically overlap each other; a first amplification stage disposed under and vertically overlapped by the first plane memory cell, wherein the first amplification stage is configured to generate a first operating voltage to be applied to the plurality of word lines so as to operate the first plane memory cell; a second amplification stage disposed under and vertically overlapped by the second plane memory cell, wherein the first amplification stage is configured to generate a second operating voltage to be applied to the plurality of word lines so as to operate the second plane memory cell; and a common amplification stage which is disposed under but is not overlapped by the memory cell array, is disposed on the substrate, wherein the common amplification stage is configured to generate a third operating voltage to be applied to the plurality of word lines so as to operate the first plane memory cell and the second plane memory cell, wherein the first amplification stage includes first lower wirings electrically connected to the memory cell array, the second amplification stage includes second lower wirings electrically connected to the memory cell array, the common amplification stage includes common lower wirings electrically connected to the memory cell array and a plurality of through vias electrically connecting the common lower wirings and upper wirings disposed higher than the memory cell array, and the common amplification stage is connected in series to each of the first amplification stage and the second amplification stage.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments according to the technical spirit of the present disclosure will be described with reference to the attached drawings.

Figure 1:
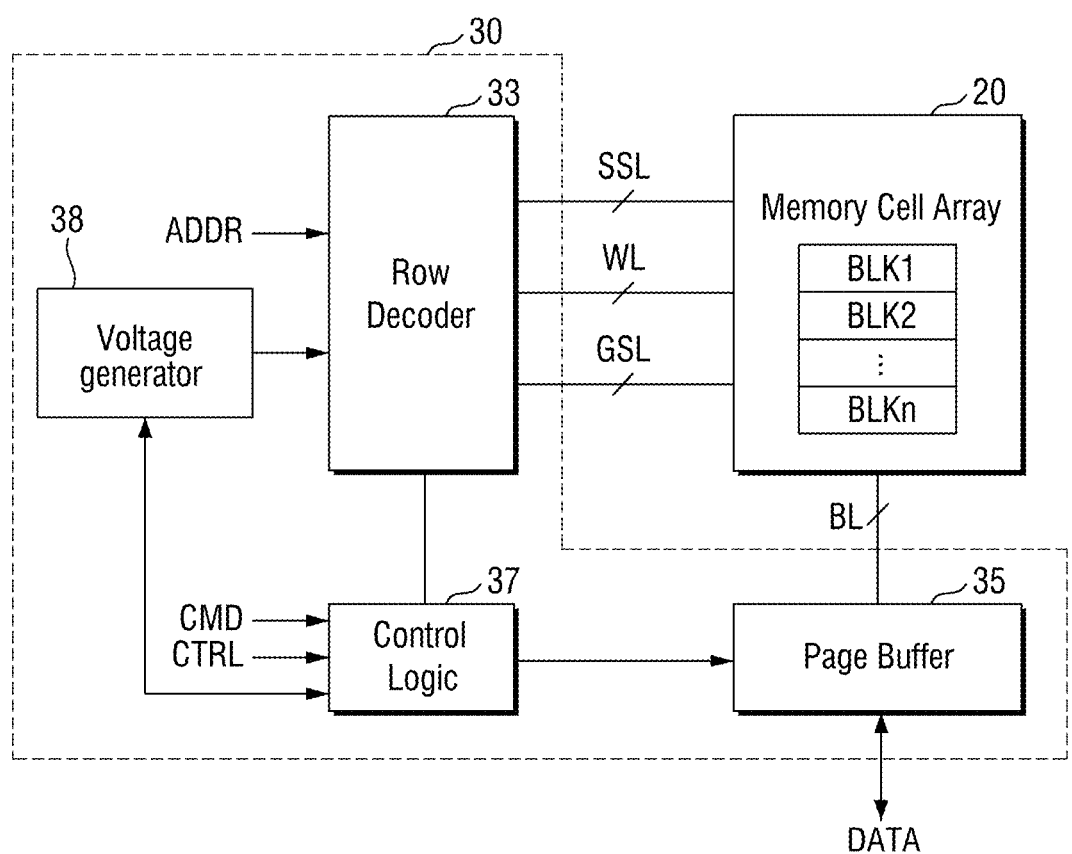
FIG. 1 is a block diagram of a semiconductor memory device according to some embodiments.

FIG. 1 is a block diagram of a semiconductor memory device 10 according to embodiments.

Referring to FIG. 1, the semiconductor memory device 10 according to the embodiments may include a memory cell array 20 and a peripheral circuit 30.

The memory cell array 20 may include a plurality of memory cell blocks BLK1 through BLKn. Each of the memory cell blocks BLK1 through BLKn may include a plurality of memory cells. The memory cell blocks BLK1 through BLKn may be connected to the peripheral circuit 30 through bit lines BL, word lines WL, at least one string select line SSL, and at least one ground select line GSL.

Specifically, the memory cell blocks BLK1 through BLKn may be connected to a row decoder 33 through the word lines WL, at least one string select line SSL and at least one ground select line GSL. In addition, the memory cell blocks BLK1 through BLKn may be connected to a page buffer 35 through the bit lines BL.

The peripheral circuit 30 may receive an address ADDR, a command CMD and a control signal CTRL from outside the semiconductor memory device 10 and transmit and receive data DATA to and from a device outside the semiconductor memory device 10. The peripheral circuit 30 may include a control logic 37, the row decoder 33, the page buffer 35, and a voltage generator 38 for generating various voltages required for operation.

Although not illustrated, the peripheral circuit 30 may further include various sub-circuits such as an input/output circuit and an error correction circuit for correcting an error of the data DATA read from the memory cell array 20 of the semiconductor memory device 10.

The control logic 37 may be connected to the row decoder 33, the voltage generator 38 and the input/output circuit. The control logic 37 may control the overall operation of the semiconductor memory device 10. The control logic 37 may generate various internal control signals used in the semiconductor memory device 10 in response to the control signal CTRL.

For example, the control logic 37 may adjust levels of voltages provided to the word lines WL and the bit lines BL during a memory operation such as a program operation or an erase operation.

The row decoder 33 may select at least one of the memory cell blocks BLK1 through BLKn in response to the address ADDR and select at least one word line WL, at least one string select line SSL and at least one ground select line GSL of the selected memory cell block. The row decoder 33 may apply a voltage for performing a memory operation to the word line WL of the selected memory cell block.

The page buffer 35 may be connected to the memory CCU array 20 through the bit lines BL. The page buffer 35 may operate as a write driver or a sense amplifier. Specifically, during a program operation, the page buffer 35 may operate as a writer driver and apply a voltage corresponding to the data DATA to be stored in the memory cell array 20 to the bit lines BL. During a read operation, the page buffer 35 may operate as a sense amplifier and sense the data DATA stored in the memory cell array 20.

Figure 2:
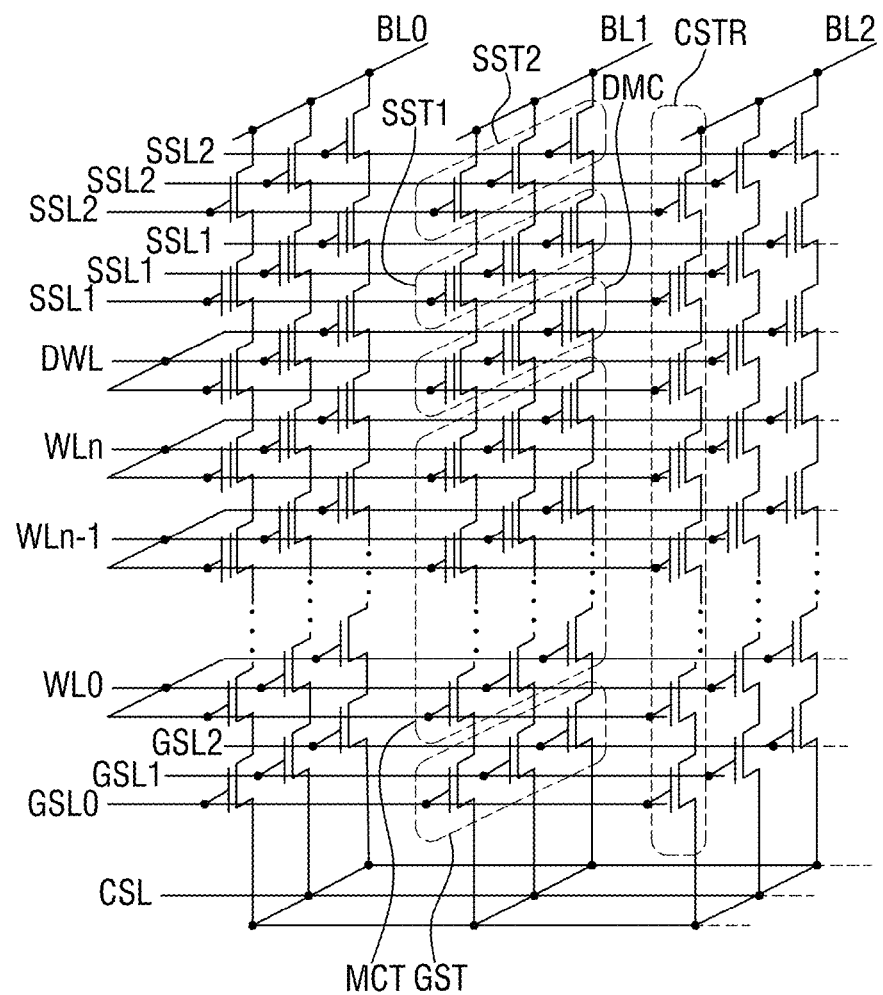
FIG. 2 is a circuit diagram of one of a plurality of memory cell blocks included in the semiconductor memory device according to some embodiments.

FIG. 2 is a circuit diagram of one of the memory cell blocks BLK1 through BLKn included in the semiconductor memory device 10 according to the embodiments.

Referring to FIG. 2, a memory cell block according to the embodiments may include a common source line CSL, a plurality of bit lines BL (BL0 through BL2), and a plurality of cell strings CSTR disposed between the common source line CSL and the bit lines BL (BL0 through BL2).

The cell strings CSTR may be connected in parallel to each of the bit lines BL0 through BL2. The cell strings CSTR may be connected in common to the common source line CSL. That is, the cell strings CSTR may be disposed between one common source line CSL and the bit lines BL0 through BL2. The common source line CSL may also be provided in plural numbers, and common source lines CSL may be arranged in two dimensions. In this case, electrically the same voltage may be applied to the common source lines CSL, or each of the common source lines CSL may be electrically controlled.

For example, each of the cell strings CSTR may consist ref string select transistors SST1 and SST2 connected in series, memory cells MCT connected in series, and a ground select transistor GST. In addition, each of the memory cells MCT includes a data storage element.

In an example, each of the cell strings CSTR may include first and second string select transistors SST1 and SST2 connected in series, the second string select transistor SST2 may be connected to the bit lines BL0 through BL2, and the ground select transistor GST may be connected to the common source line CSL. The memory cells MCT may be connected in series between the first string select transistor SST1 and the ground select transistor GST.

Further, each of the cell strings CSTR may further include a dummy cell DMC connected between the first string select transistor SST1 and the memory cells MCT. Although not illustrated in the drawing, the dummy cell DMC may also be connected between the ground select transistor GST and the memory cells MCT. In another example, in each of the cell strings CSTR, the ground select transistor GST, like the first and second string select transistors SST1 and SST2, may consist of a plurality of metal oxide semiconductor (MOS) transistors connected in series. In another example, each of the cell strings CSTR may include one string select transistor.

According to embodiments, the first string select transistor SST1 may be controlled by a first string select line SSL1, and the second string select transistor SST2 may be controlled by a second string select line SSL2. The memory cells MCT may be controlled by a plurality of word lines WL0 through WLn, and the dummy cell DMC may be controlled by a dummy word line DWL. In addition, the ground select transistor GST may be controlled by a ground select line GSL. The common source line CSL may be connected in common to sources of the ground select transistors GST.

One cell string CSTR may consist of a plurality of memory cells MCT located at different distances from the common source line CSL. In addition, the Word lines WL0 through WLn may be disposed between the common source line CSL and the bit lines BL0 through BL2.

Gate electrodes of the memory cells MCT located at substantially the same distance from the common source line CSL may be connected in common to one of the word lines WL0 through WLn and DWL and may thus be in an equipotential state. Alternatively, even if the gate electrodes of the memory cells MCT are disposed at substantially the same level from the common source line CSL, gate electrodes disposed in different rows or columns may be controlled independently.

Ground select lines GSL0 through GSL2 and string select lines SSL1 and SSL2 may extend in the same direction as, for example, the word lines WL0 through WLn and DWL. The ground select lines GSL0 through GSL2 and the string select lines SSL1 and SSL2 disposed at substantially the same level from the common source line CSL may be electrically isolated from each other.

Figure 3:
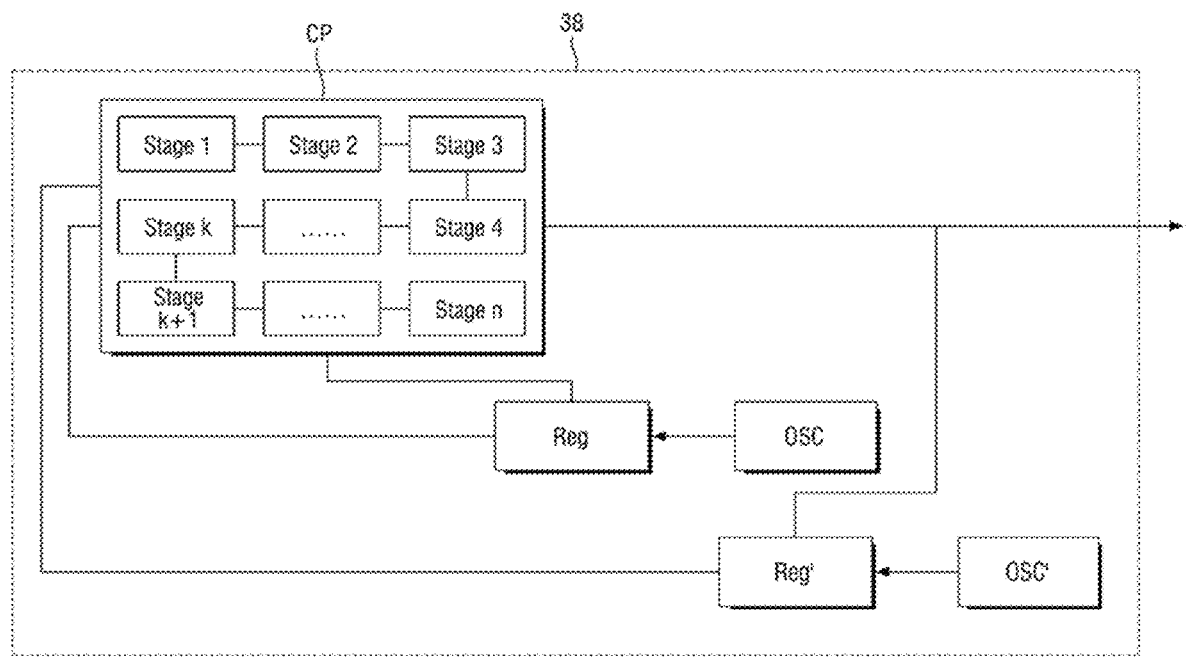
FIG. 3 is a block diagram of a voltage generator included in the semiconductor memory device according to some embodiments.
Figure 4A:
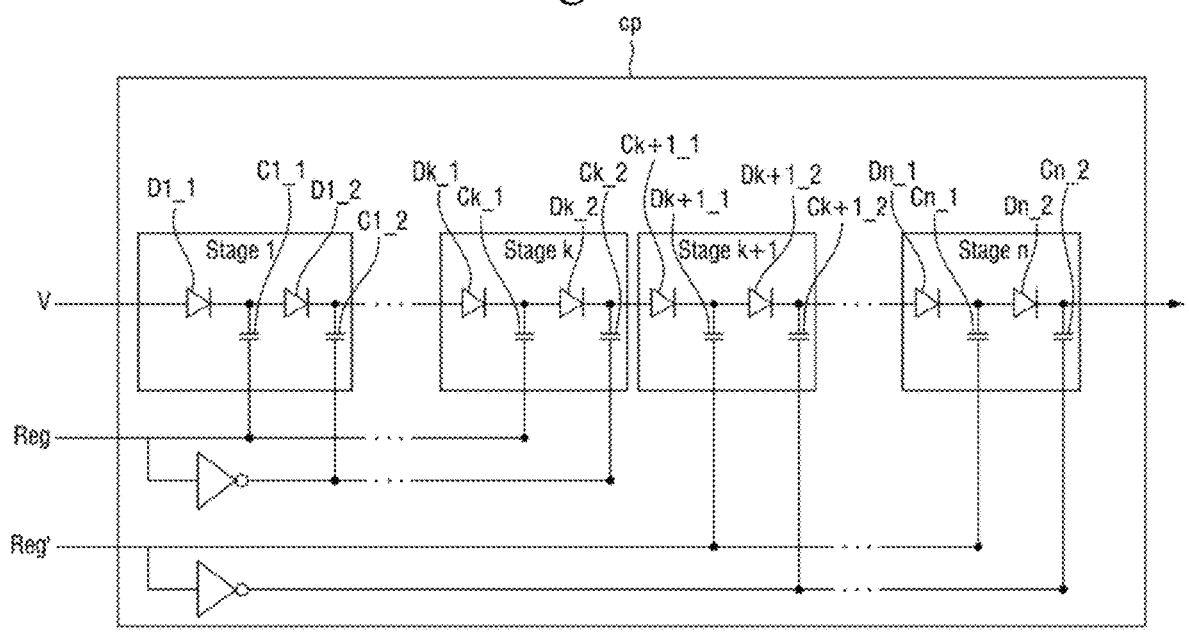
FIG. 4A and FIG. 4B are a circuit diagram of a charge pump included in the voltage generator according to some embodiments.
Figure 4B:
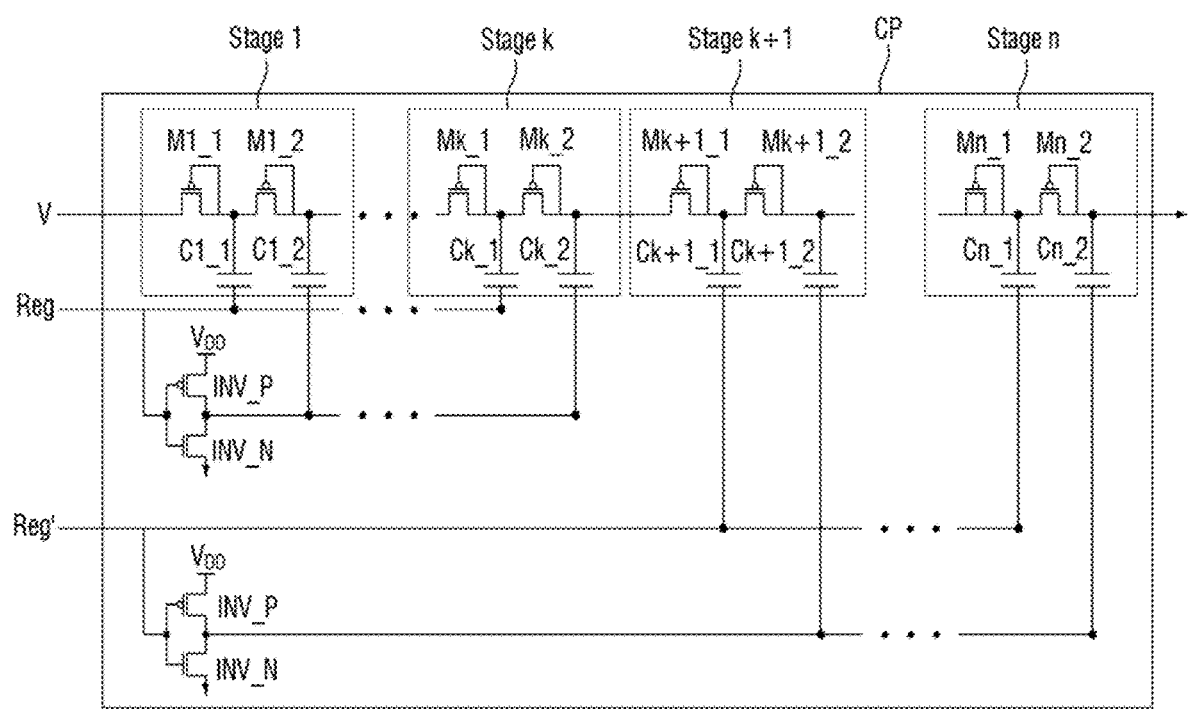

FIG. 3 is a block diagram of the voltage generator 38 included in the semiconductor memory device 10 according to the embodiments. FIG. 4A and FIG. 4B are a circuit diagram of a charge pump CP included in the voltage generator 38 according to some embodiments. FIG. 4B is an analog circuit diagram of FIG. 4A.

Referring to FIGS. 1, 3, 4A and 4B, the voltage generator 38 included in the semiconductor memory device 10 according to the embodiments may include the charge pump CP a first regulator Reg, a first oscillator OSC, a second regulator Reg' and a second oscillator OSC' and, although not illustrated, may include a voltage source which supplies power to the charge pump CP.

The charge pump CP may include a plurality of amplification stages Stage 1 through Stage n. The charge pump CP may provide a current through the row decoder 33 in order to apply an operating voltage to the word lines WL of the memory cell array 20.

The first regulator Reg and the second regulator Reg' are separately connected to the charge pump CP and are respectively connected to the first oscillator OSC and the second oscillator OSC'. The oscillators OSC and OSC' provide constant clock signals to the regulators Reg and Reg', respectively. The clock signals provided by the first oscillator OSC and the second oscillator OSC' may be different or the same in frequency.

The first regulator Reg of the semiconductor memory device 10 according to the embodiments may generate a clock signal received from the first oscillator OSC based on feedback on a voltage applied to a node (not illustrated) between the amplification states Stage 1 through Stage n in the charge to pump CP and the control signal CTRL of the control logic 37 and provide the clock signal to the charge pump CP.

The second regulator Reg' of the semiconductor memory device 10 according to the embodiments may generate a clock signal received from the second oscillator OSC' based on feedback on a voltage applied to the word lines WL through the row decoder 33 and the control signal CTRL of the control logic 37 and provide the clock signal to the charge pump CP.

That is, the first regulator Reg may provide a first clock signal to the charge pump CP based on a signal of the first oscillator OSC, and the second regulator Reg' may provide a second clock signal to the charge pump CP based on a signal of the second oscillator OSC'.

According to an embodiment, the amplification stages Stage 1 through Stage n in the charge pump CP may be connected to different regulators. According to FIGS. 4A and 4B, first through $k^{th}$ amplification stages Stage 1 through Stage k may be connected to the first regulator Reg, and $(k+1)^{th}$ through $n^{th}$ stages Stage k+1 through Stage n may be connected to the second regulator Reg'. The connection relationship between the charge pump CP and the regulators Reg and Reg' according to the embodiments is not limited to that illustrated in FIGS. 4A and 4B.

Each of the amplification stages Stage 1 through Stage n may include diodes and capacitors. The following description will focus on the $k^{th}$ amplification stage Stage k and differences corresponding to the other amplification stages. It is obvious that the description of the $k^{th}$ amplification stage Stage k is applicable to the other amplification stages.

The $k^{th}$ amplification stage Stage k may include a $(k\_1)^{th}$ diode Dk_1, a $(k\_2)^{th}$ diode Dk_2, a $(k\_1)^{th}$ capacitor Ck_1, and a $(k\_2)^{th}$ capacitor Ck_2.

Each of the $(k\_1)^{th}$ diode Dk_1 and the $(k\_2)^{th}$ diode Dk_2 may include a $(k\_1)^{th}$ transistor Mk_1 and a $(k\_2)^{th}$ transistor Mk_2, respectively, and each of gates of the $(k\_1)^{th}$ transistor Mk_1 and the $(k\_2)^{th}$ transistor Mk_2 can be connected to each of the source drain. The $k^{th}$ amplification stage Stage k may include a structure of Dickson charge pump as shown in FIG. 4B, and the $(k\_1)^{th}$ transistor Mk_1 find the $(k\_2)^{th}$ transistor Mk_2 may be P-type transistors, but the structure and the configuration don't limit the technical spirit of the present disclosure.

The $(k\_1)^{th}$ diode Dk_1 may be connected between the $(k-1)^{th}$ amplification stage (not illustrated, except k=1) and the $(k\_2)^{th}$ diode Dk_2, and the $(k\_2)^{th}$ diode Dk_2 may be connected between the $(k\_1)^{th}$ diode Dk_1 and the $(k\_1)^{th}$ stage Stage k+1 (except k=n).

The $(k\_1)^{th}$ capacitor Ck_1 have an end connected between the $(k\_1)^{th}$ diode Dk_1 and the $(k\_2)^{th}$ diode Dk_2 and the other end connected to the first regulator Reg. The $(k\_2)^{th}$ capacitor Ck_2 may have an end connected between the $(k\_2)^{th}$ diode Dk_2 and the $(k\_1)^{th}$ stage Stage k+1 and the other end connected to an inverter that inverts a signal of the first regulator Reg.

The amplification stages excluding the $k^{th}$ amplification stage Stage k may have the same connection relationship as the $k^{th}$ amplification stage Stage k illustrated in FIGS. 4A and 4B except that the $(k+1)^{th}$ through $n^{th}$ amplification stages Stage k+1 through Stage n are connected to the second regulator Reg', a $(1\_1)^{th}$ diode D1_1 is connected between the voltage source (not illustrated) and a $(1\_2)^{th}$ diode D1_2, and a $(n\_2)^{th}$ diode Dn_2 is connected between a $(n\_1)^{th}$ diode Dn_1 and the row decoder 33. However, the charge pump CP according to the embodiments is not limited to the configuration and the connection relationship illustrated in FIGS. 4A and 4B.

The charge pump CP may include a plurality of capacitors C1_1 through Cn_2. The capacitors C1_1 through Cn_2 may accumulate charges, and the accumulated charges may be provided to the word lines WL of the memory cell array 20 through the row decoder 33. Thus, various voltages such as a program voltage may be applied to the word lines WL.

Figure 5:
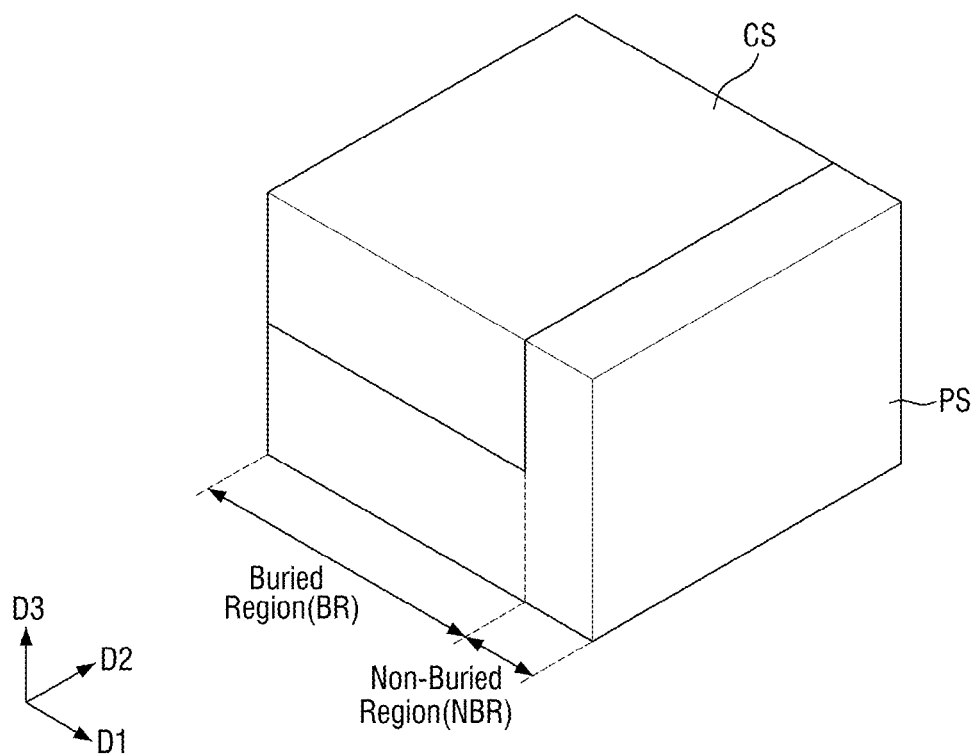
FIG. 5 is a schematic perspective view of the semiconductor memory device according to some embodiments.
Figure 6:
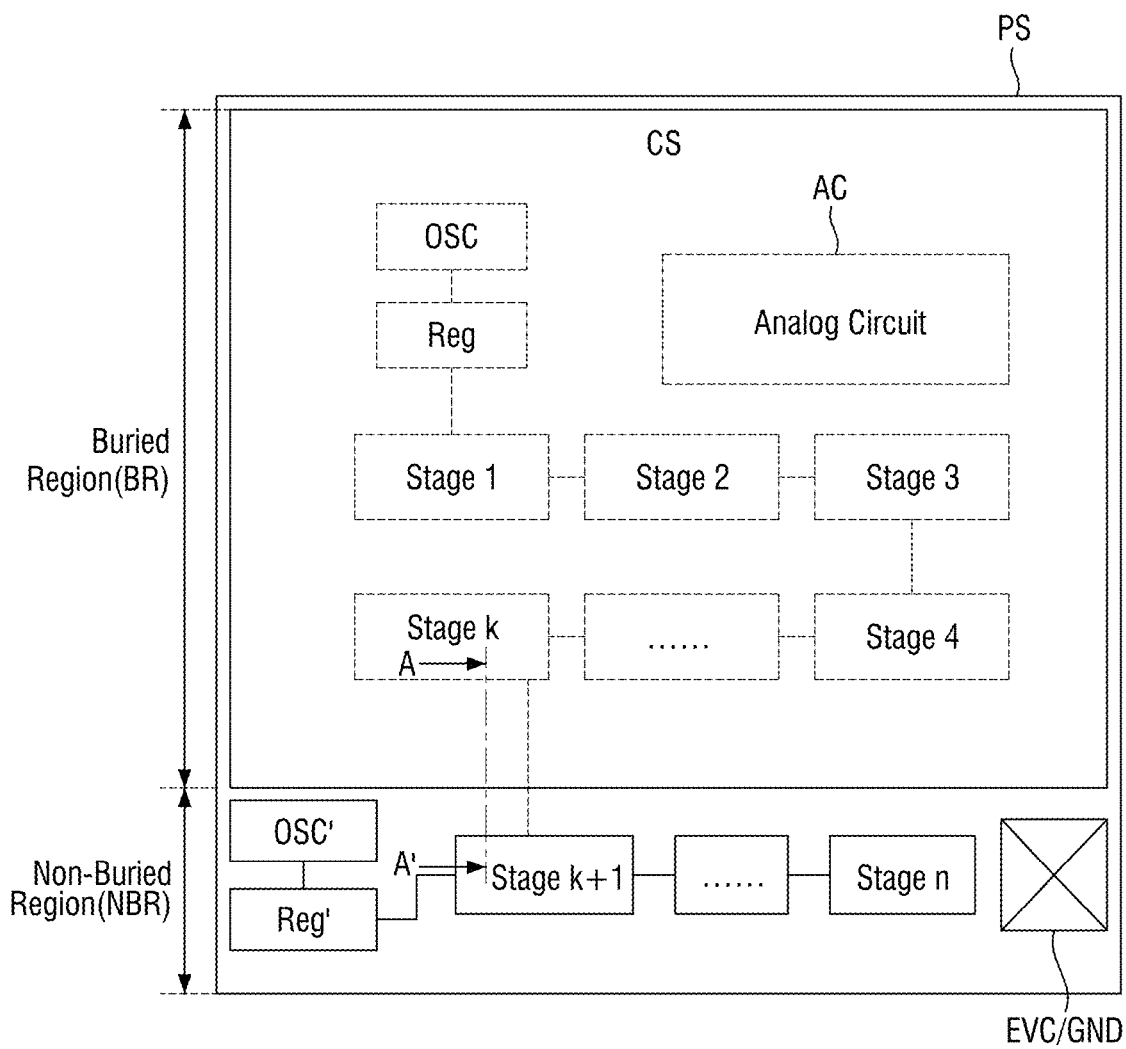
FIG. 6 is a plan block diagram of the semiconductor memory device including a peripheral logic structure according to some embodiments.
Figure 7:
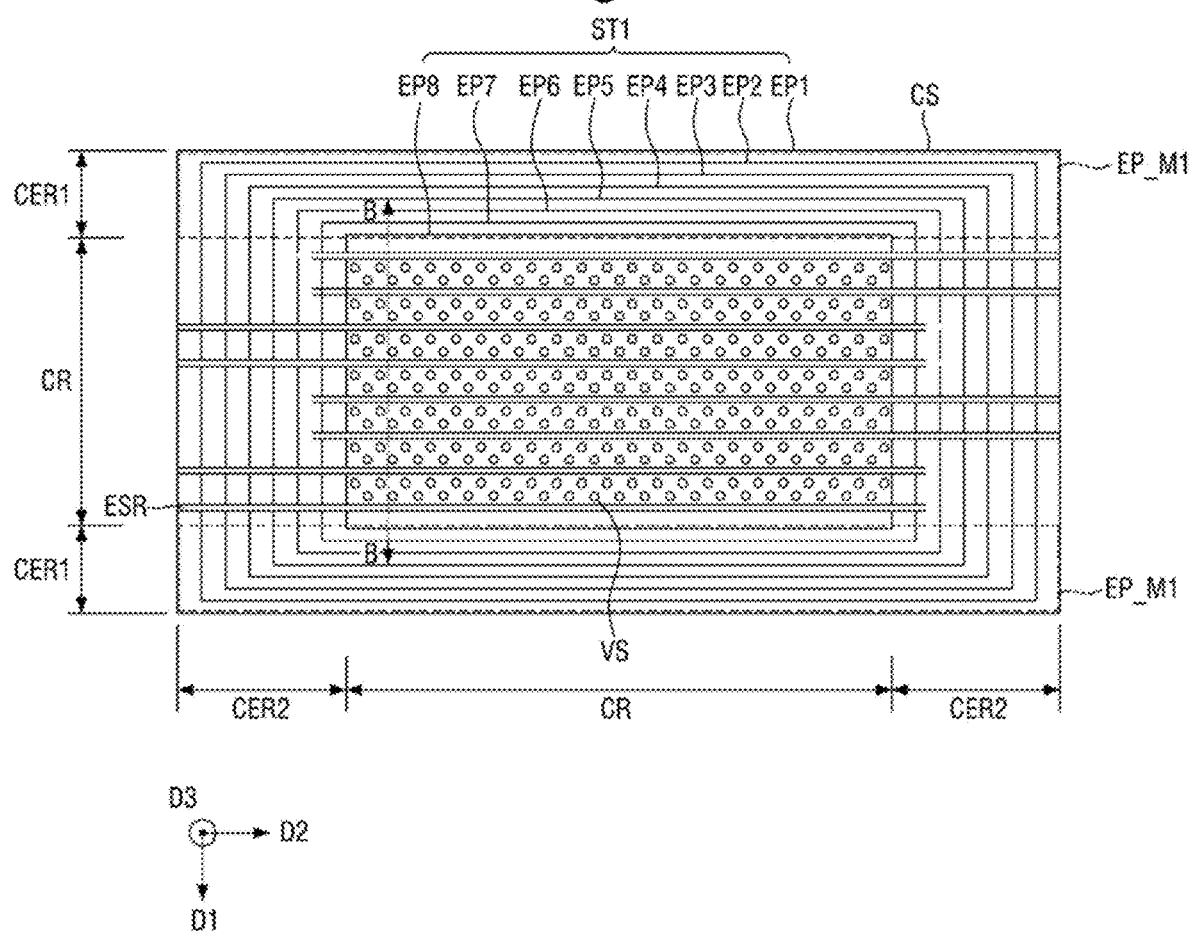
FIG. 7 is a plan view of a cell array structure of FIG. 5.
Figure 8:
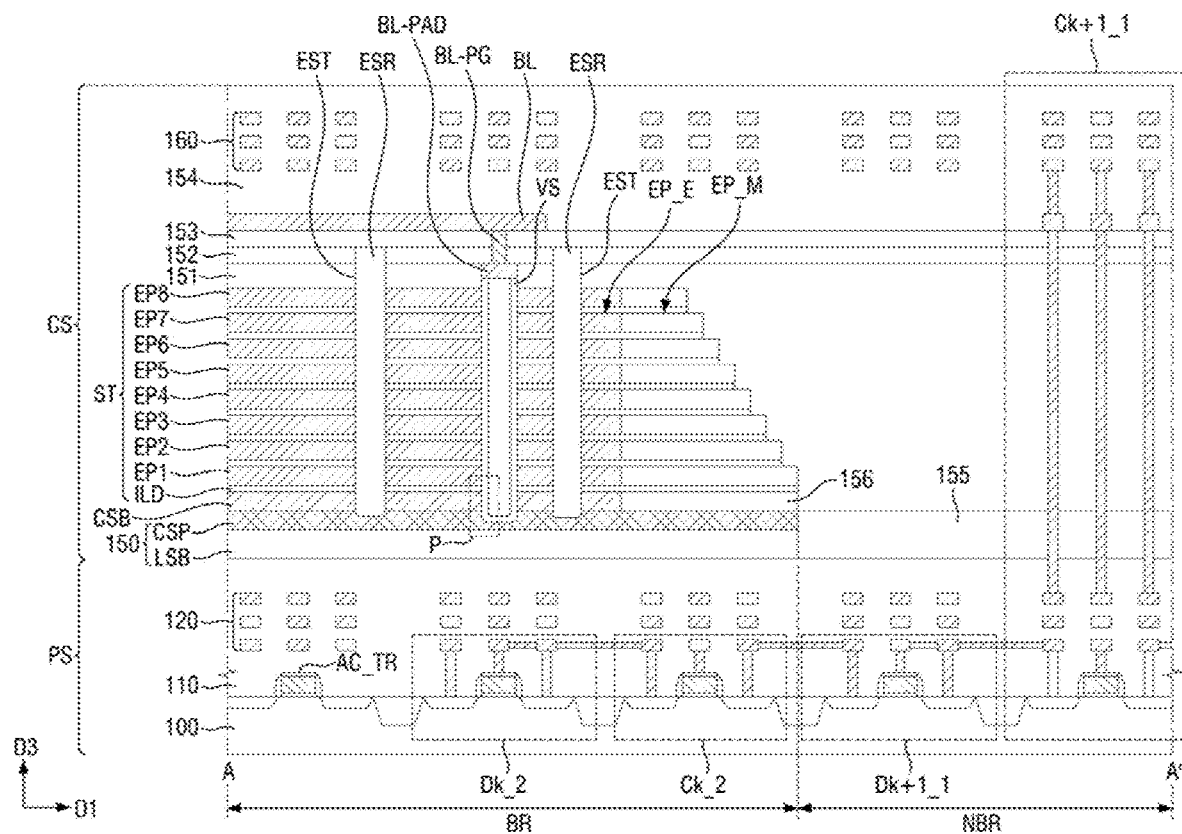
FIG. 8 is a cross-sectional view taken along A-A' of FIG. 6.
Figure 9:
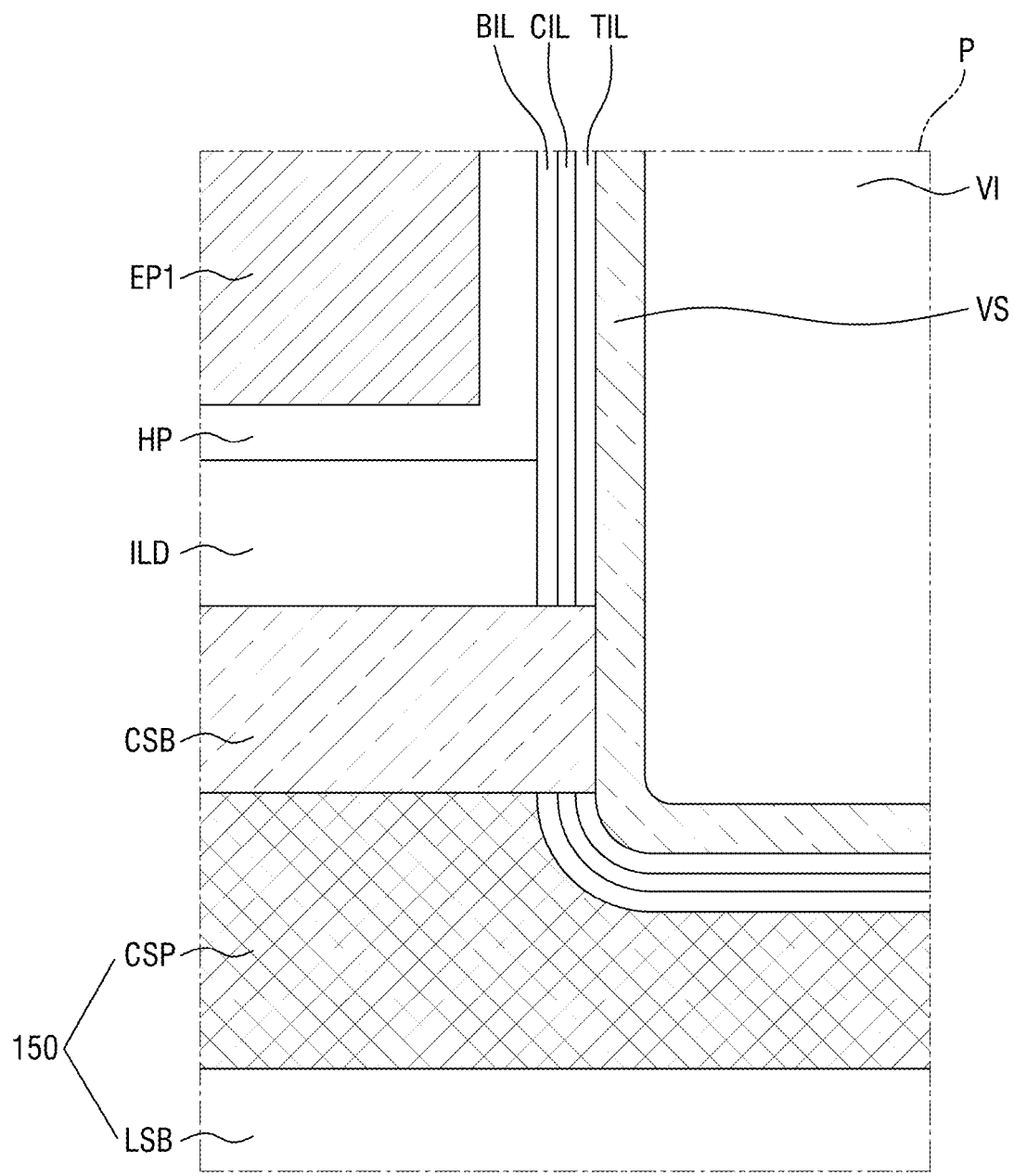
FIG. 9 is an enlarged view of a portion P of FIG. 8.
Figure 10:
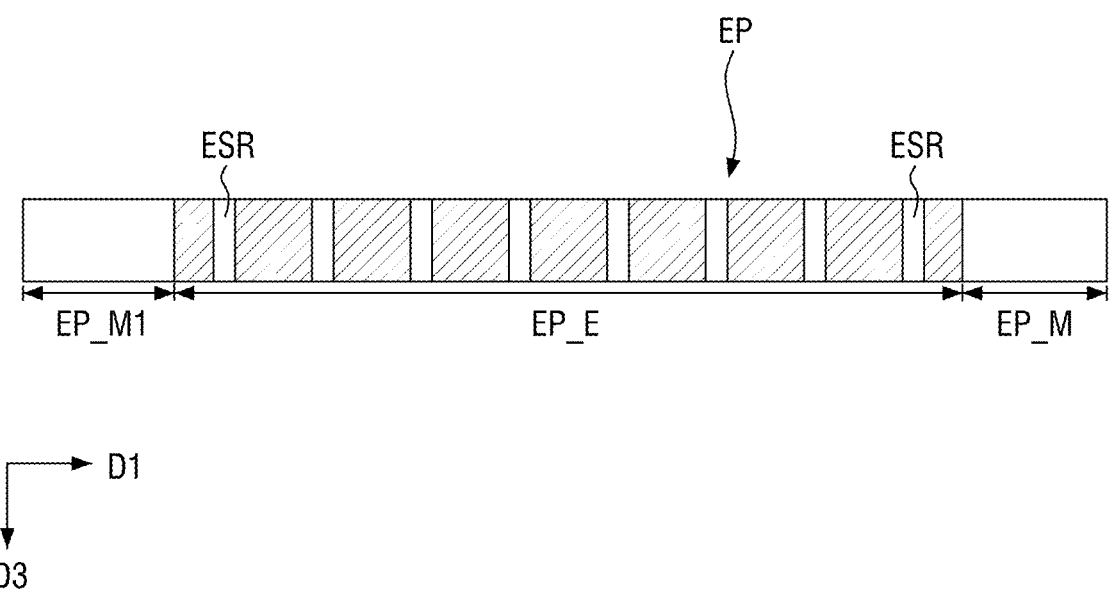
FIG. 10 is a cross-sectional view taken along line B-B' of FIG. 7.

FIG. 5 is a schematic perspective view of the semiconductor memory device 10 according to the embodiments. FIG. 6 is a plan block diagram of the semiconductor memory device 10 including a peripheral logic structure PS according to the embodiments. FIG. 7 is a plan view of a cell array structure CS of FIG. 5. FIG. 8 is a cross-sectional view taken along A-A' of FIG. 6. FIG. 9 is an enlarged view of a portion P of FIG. 8. FIG. 10 is a cross-sectional view taken along line B-B' of FIG. 7.

Referring to FIGS. 5 through 10, the semiconductor memory device 10 according to the embodiments may include the peripheral logic structure PS and the cell array structure CS.

The peripheral logic structure PS according to the embodiments may include the first through $n^{th}$ amplification stages Stage 1 through Stage n, the first and second regulators Reg and Reg', the first and second oscillators OSC and OSC', an analog circuit AC, a lower wiring structure 120, and an upper wiring structure 160. In addition, the peripheral logic structure PS may include the page buffer 35 of FIG. 1 and the row decoder 33 of FIG. 1.

The peripheral logic structure PS may include a buried region BR overlapped by the cell array structure CS in a direction perpendicular to a substrate 100, a non-buried region NBR not overlapped by the cell array structure CS in the direction perpendicular to the substrate 100, and a part of the upper wiring structure 160 not included in the non-buried region NBR but disposed on the cell array structure CS.

The buried region BR may include the first regulator Reg, the first oscillator OSC, the first through $k^{th}$ amplification stages Stage 1 through Stage k connected to the first regulator Reg as illustrated in FIGS. 4A and 4B, and an analog circuit transistor AC_Tr included in the analog circuit AC.

The non-buried region NBR may include a second regulator Reg', the second oscillator OSC', the $(k+1)^{th}$ through $n^{th}$ amplification stages Stage k+1 through Stage n connected to the second regulator Reg' as illustrated in FIGS. 4A and 4B, and an external voltage contact EVC or a ground pad GND.

According to embodiments, distances between the external voltage contact EVC or the ground pad GND and the amplification stages Stage 1 through Stage k disposed in the buried region BR may be greater than distances between the external voltage contact EVC or the ground pad GND and the amplification stages Stage k+1 through Stage n disposed in the non-buried region NBR.

The cell array structure CS include a horizontal semiconductor layer 150 disposed on the buried region BR and a stacked structure ST disposed on the horizontal semiconductor layer 150. The horizontal semiconductor layer 150 may be disposed on the buried region BR. The horizontal semiconductor layer 150 may extend along an upper surface of the buried region BR.

The substrate 100 may be bulk silicon or silicon-on-insulator (SOI). Alternatively, the substrate 100 may be, but is not limited to, a silicon substrate or a substrate made of another material such as silicon germanium, silicon germanium on insulator (SGOI), indium antimonide, lead telluride, indium arsenide, indium phosphide, gallium arsenide, or gallium antimonide.

A peripheral logic insulating layer 110 may be formed on the substrate 100. The peripheral logic insulating layer 110 may include at least one of, for example, silicon oxide, silicon nitride, and silicon oxynitride.

The lower wiring structure 120 may be formed in the peripheral logic insulating layer 110. As illustrated in FIG. 8, a part of the lower wiring structure 120 may be included in the $(k\_2)^{th}$ diode Dk_2 and the $(k\_2)^{th}$ capacitor Ck_2 disposed in the buried region BR and in a $(k+1\_1)^{th}$ diode Dk+1_1 and a $(k+1\_1)^{th}$ capacitor Ck+1_1 disposed in the non-buried region NBR. The above configuration and wiring will be described later.

Each horizontal semiconductor layer 150 may include a lower support semiconductor layer LSB and a common source plate CSP disposed on the lower support semiconductor layer LSB. The horizontal semiconductor layer 150 may include at least one of silicon (Si), germanium (Ge), silicon germanium (SiGe), gallium arsenide (GaAs), indium gallium arsenide (InGaAs), aluminum gallium arsenide (AlGaAs), and mixtures of the same. The horizontal semiconductor layer 150 may have a crystal structure including at least one of monocrystals, amorphous crystals, and polycrystals.

The common source plate CSP may serve as the common source line CSL of FIG. 2.

Unlike in the drawings, each horizontal semiconductor layer 150 may be the common source plate CSP without the lower support semiconductor layer LSB.

Alternatively, unlike in the drawings, not a common source plate in the shape of a two-dimensional plane but a common source line in the shape of a line extending along a second direction D2 may be formed in the horizontal semiconductor layer 150.

In FIGS. 7 and 8, the stacked structure ST may include a plurality of electrodes pads EP1 through EP8 stacked in a third direction D3. A first stacked structure ST1 may include an inter-electrode insulating layer ILD disposed between the electrode pads EP1 through EP8. Although the stacked structure ST is illustrated as including eight electrode pads, this is merely for ease of description, and embodiments are not limited to this case.

The electrode pads EP1 through EP8 stacked in the third direction D3 may include gate electrodes included in the string select transistors SST1 and SST2 and the ground select transistors GST described above with reference to FIG. 2. In addition, the electrode pads EP1 through EP8 stacked in the third direction D3 may include the word lines WL of the memory cells MCT.

For example, the stacked structure ST may include a fourth electrode pad EP4 and a fifth electrode EP5 adjacent to each other in the third direction D3. The fifth electrode pad EP5 may be disposed on the fourth electrode pad EP4.

The fourth electrode pad EP4 may protrude further in a first direction D1 than the fifth electrode pad EP5, and the fourth electrode pad EP4 may protrude further in the second direction D2 than the fifth electrode pad EP5 (not illustrated). That is, the fourth electrode pad EP4 may protrude further in the first and second directions D1 and D2 than the fifth electrode pad EP5 to form a stepped structure not only in the first direction D1 but also in the second direction D2.

The stacked structure ST may include a cell region CR and a first cell extension region CER1 extending in the first direction D1 from the cell region CR. In addition, the first stacked structure ST may include a second cell extension region CER2 extending in the second direction D2 from the cell region CR.

A plurality of electrode separation regions ESR may be disposed in the stacked structure ST. Each of the electrode separation regions ESR may extend in the second direction D2.

The first stacked structure ST1 may include a plurality of electrode separation trenches EST. The electrode separation regions ESR may fill the electrode separation trenches EST, respectively.

In an example, each of the electrode separation regions ESR may include an insulating material that fills an electrode separation trench EST. The electrode separation regions ESR may include, for example, silicon oxide.

In another example, unlike in the drawings, each of the electrode separation regions ESR may include a liner formed along sidewalls of an electrode separation trench EST and a filling layer disposed on the liner to fill the electrode separation trench EST. For example, the liner may include an insulating material, and the filling layer may include a conductive material. For another example, the liner may include a conductive material, and the filling layer may include an insulating material.

Length of at least some of the electrode separation regions ESR in the second direction D2 may be smaller than a width of the stacked structure ST in the second direction D2 and, in some cases, may be equal to or greater than the width. In FIG. 7, the lengths of the electrode separation regions ESR in the second direction D2 are smaller than the width of the stacked structure ST in the second direction D2. However, embodiments are not limited to this case.

The electrode separation regions ESR may not be disposed in the first cell extension region CER1. The electrode separation trenches EST in which the electrode separation regions ESR are formed are used in a replacement process for forming the word lines WL0 though WLn (see FIG. 2). That is, parts of a mold layer are removed using the electrode separation trenches EST, and word lines are formed in the removed parts of the mold layer.

When the mold layer is removed using the electrode separation trenches EST, not all of the mold layer of the first cell extension region CER1 is removed. Therefore, unremoved parts of the mold layer may remain in the first cell extension region CER1. The first cell extension region CER1 includes a mold region EP_M extending in the second direction D2. That is, the stacked structure ST1 includes a first mold region EP_M disposed on both sides of the cell region CR in the first direction D1.

In the semiconductor memory device 10 according to the embodiments, each of the electrode pads EP1 through EP8 includes an electrode region EP_E and the first mold region EP_M. The electrode region EP_E may include, for example, tungsten (W).

For example, in FIG. 10, an electrode pad EP may include the electrode region EP_E and the mold region EP_M disposed on both sides of the electrode region EP_E in the first direction D1. The electrode region EP_E may be divided by the electrode separation regions ESR extending in the second direction D2. The mold region EP_M may extend in the first direction D1 from the electrode region EP_E.

The electrode separation regions ESR may include a first electrode separation region and a second electrode separation region spaced farthest away from each other in the first direction D1. Here, the electrode region EP_E may be disposed between the first electrode separation region and the second electrode separation region. A part of the electrode region EP_E may be located in an area other than the area between the first electrode separation region and the second electrode separation region.

A width in the first direction D1 of the first mold region EP_M1 included in each of the electrode pads EP1 through EP8 may decrease as a distance from the peripheral logic structure PS increases. For example, the width in the first direction D1 of the first mold region EP_M1 included in the fourth electrode pad EP4 is greater than the width in the first direction D1 of the first mold region EP_M1 included in the fifth electrode pad EP5.

For example, the first mold region EP_M1 included in the fourth electrode pad EP4 may protrude further in the first direction D1 than the first mold region EP_M1 included in the fifth electrode pad EP5 by a first width W1.

A sidewall of the first mold region EP_M1 included in the fourth electrode pad EP4 facing a second stacked structure ST2 and a sidewall of the first mold region EP_M1 included in the fifth electrode pad EP5 may be spaced apart by the first width W1 in the first direction D1.

A sidewall profile of a stepped structure of the first stacked structure ST1 shown in a cross-sectional view taken along the first direction D1 may be defined by the mold region EP_M included in each of the electrode pads EP1 through EP8. The mold region EP_M may include, but is not limited to, silicon nitride.

A plurality of vertical structures VS penetrating the stacked structure ST may be disposed between adjacent electrode separation regions ESR. Each of the vertical structures VS may be connected to the horizontal semiconductor layer 150.

For example, some of the vertical structures VS which are used as channel regions of the memory cells may be electrically connected to the common source plate CSP included in the horizontal semiconductor layer 150.

The vertical structures VS may include, for example, a semiconductor material such as silicon (Si), germanium (Ge), or a mixture of the same. Alternatively, the vertical structures VS may include a metal oxide semiconductor material.

A blocking insulating layer BIL, a charge storage layer CIL, and a tunnel insulating layer TIL may be sequentially disposed between each of the vertical structures VS and the stacked structure ST. However, the blocking insulating layer BIL, the charge storage layer CIL, and the tunnel insulating layer TIL disposed between each of the vertical structures VS and the stacked structure ST are merely an example, and embodiments are not limited to this example.

A vertical insulating layer VI may be disposed on each of the vertical structures VS. The vertical insulating layer VI may fill a space defined by each of the vertical structures VS. In addition, a horizontal insulating pattern HP may be disposed between the electrode pad EP1 and the inter-electrode insulating layer ILD and between the electrode pad EP1 and the blocking insulating layer BIL. The horizontal insulating pattern HP may include, for example, silicon oxide or a high-k insulating layer and may be included in a charge storage element DS capable of storing data between the vertical structure VS and the electrode pad EP1.

The blocking insluting layer BIL, the charge storage layer CIL and the tunnel insulating layer TIL may be separated under each of the vertical structures VS. A contact support layer CSB may be disposed between parts of the separated blocking insulating layer BIL, between parts of the separated charge storage layer CIL and between parts of the separated tunnel insulating layer TIL. The contact support layer CSB may electrically connect the common source plate CSP and each of the vertical structures VS. The contact support layer CSB may include, for example, a semiconductor material such as silicon (Si), germanium (Ge), or a mixture of the same.

Further, a sacrificial insulating layer 156 may be disposed between the stacked structure ST and the horizontal semiconductor layer 150 and between the stacked structure ST and a filling insulating layer 155. The sacrificial insulating layer 156 may contact the contact support layer CSB. The sacrificial insulating layer 156 may serve as a mold for forming the contact support layer CSB. The sacrificial insulating layer 156 may be a mold portion remaining without being removed in the process of making a space for forming the contact support layer CSB. The sacrificial insulating layer 156 may include, for example, silicon nitride.

A first interlayer insulating film 151 may be formed on the horizontal semiconductor layer 150. The first interlayer insulating film 151 may cover the stacked structure ST. The first interlayer insulating film 151 may include, for example, silicon oxide.

A second interlayer insulating film 152, a third interlayer insulating film 153, and a fourth interlayer insulating film 154 may be sequentially formed on the first interlayer insulating film 151. A part of each of the electrode separation regions ESR may extend up to the second interlayer insulating film 152.

The bit lines BL may be disposed on the stacked structure ST. The bit lines BL may extend in the first direction D1. The bit lines BL may be electrically connected to at least one of the vertical structures VS in the first direction D1.

The bit lines BL may be formed on the third interlayer insulating film 153 and covered with the fourth interlayer insulating layer 154. The bit lines BL may be electrically connected to the vertical structures VS via bit line pads BL_PAD and bit line plugs BL_PG.

The upper wiring structure 160 may be disposed on the bit lines BL or the third interlayer insulating film 153 and may be surrounded by the fourth interlayer insulating film 154. As illustrated in FIG. 8, a part of the upper wiring structure 160 may be included in the $(k+1\_1)^{th}$ capacitor Ck+1_1.

Figure 11A:
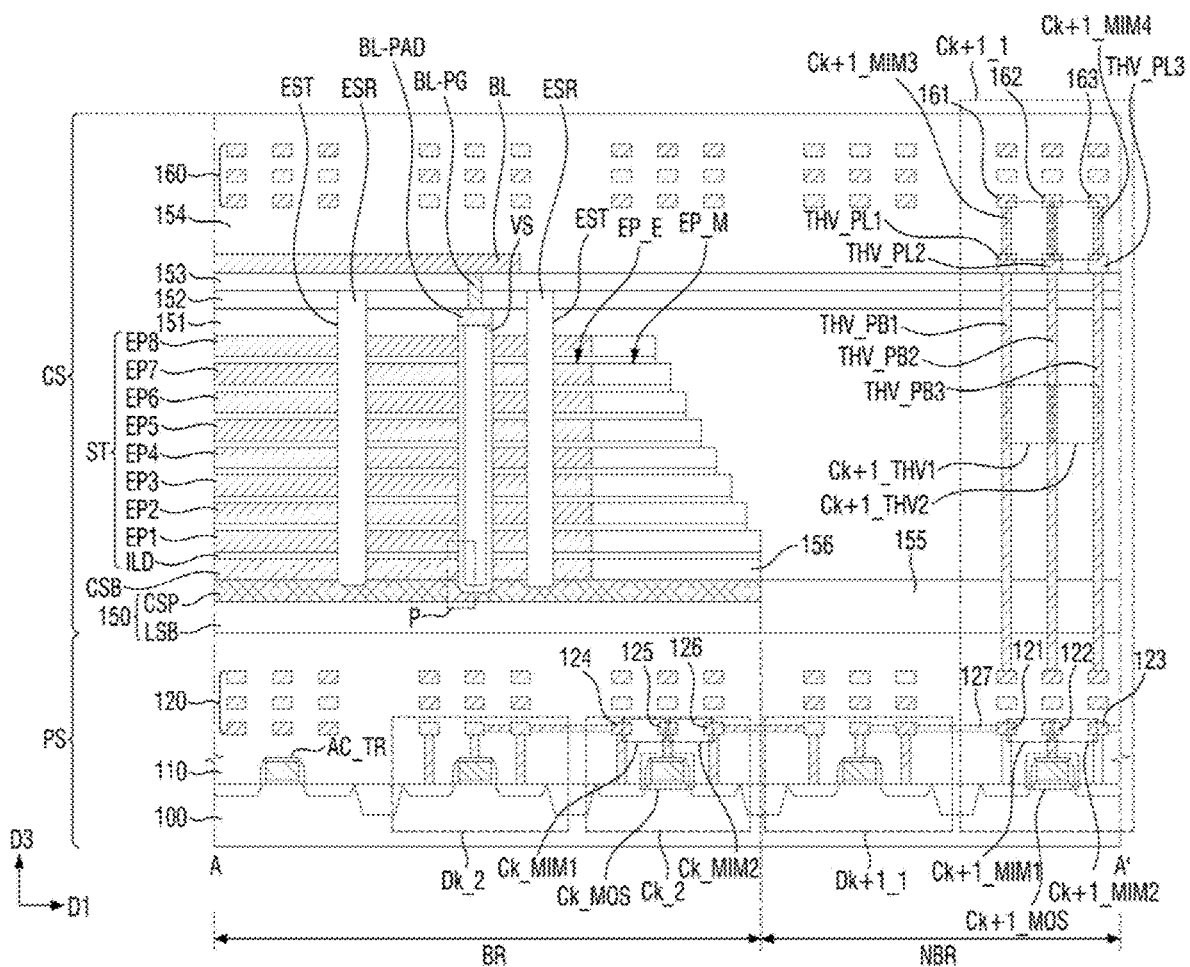
FIG. 11A illustrate, wirings and capacitors of FIG. 8.
Figure 11B:
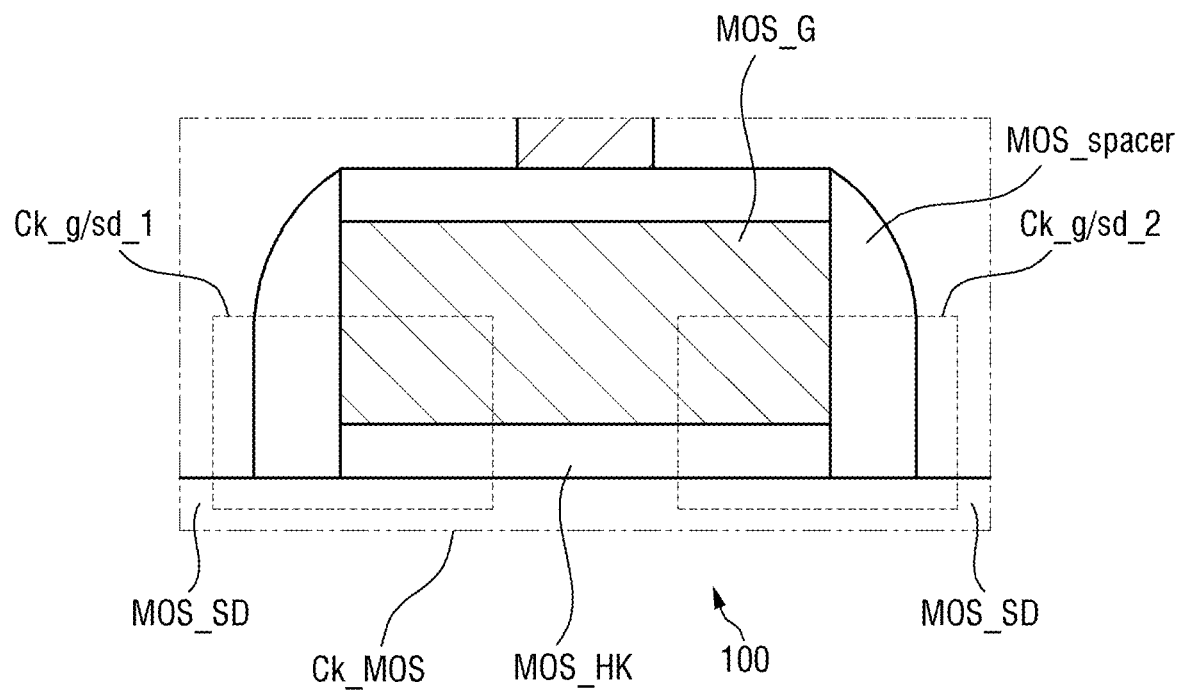
FIG. 11B is an enlarged view for describing the $k^{th}$ transistor capacitor of FIG. 11A.
Figure 12:
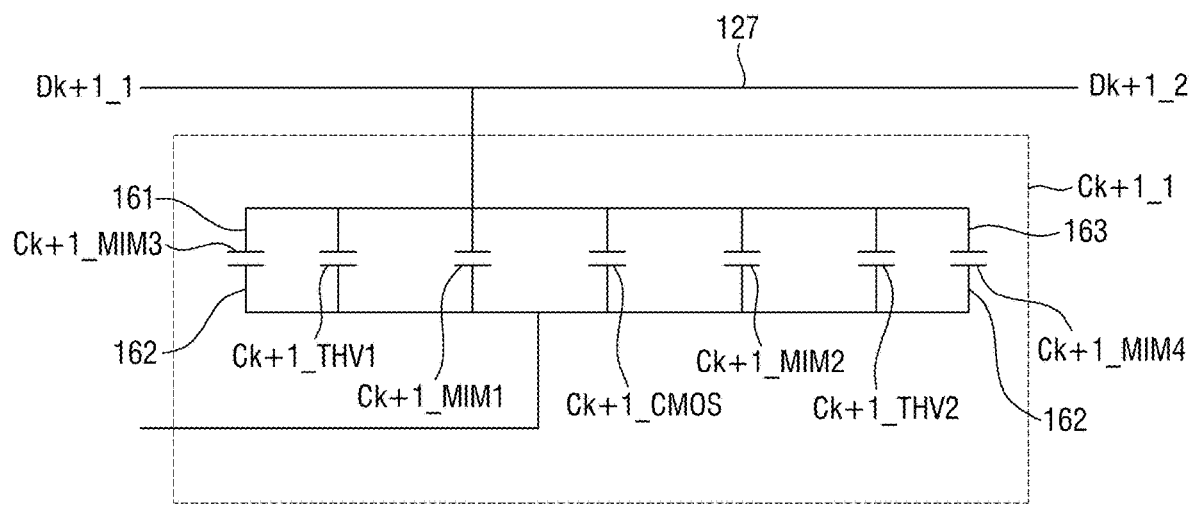
FIG. 12 is a circuit diagram of capacitors of the charge pump according to some embodiments.

FIG. 11A illustrate wirings and capacitors of FIG. 8. FIG. 11B is an enlarged view for describing the $k^{th}$ transistor capacitor of FIG. 11A. FIG. 12 is a circuit diagram of capacitors of the charge pump CP according to the embodiments.

Referring to FIGS. 11A, 11B and 12, the $(k\_2)^{th}$ diode Dk_2 and the $(k\_2)^{th}$ capacitor Ck_2 may be included in the buried region BR of the semiconductor memory device 10 according to the embodiments. The lower wiring structure 120 may include first through seventh lower wirings 121 through 127, and the upper wiring structure 160 may include first through third upper wirings 161 through 163.

The $(k\_2)^{th}$ diode Dk_2 is a diode using a transistor like the $(k\_2)^{th}$ diode Dk_2 shown in FIGS. 4A and 4B, and a wiring electrically connected to a gate electrode and a wiring electrically connected to a source/drain may be electrically connected to each other. Although the $(k\_2)^{th}$ diode Dk_2 according to the current embodiments is illustrated as a diode using a transistor, embodiments are not limited to this case, and other types of diodes such as a diode using a PN junction may be included in some cases.

The $(k\_2)^{th}$ capacitor Ck_2 may include the fourth through sixth lower wirings 124 through 126 of the lower wiring structure 120 and a transistor connected to the fourth through sixth lower wirings 124 through 126. Although not illustrated, the same voltage may be applied to the fourth lower wiring 124 and the sixth lower wiring 126 connected to a source/drain of the transistor in the $(k\_2)^{th}$ capacitor Ck_2. Here, the same voltage may be applied to the fourth and sixth lower wirings 124 and 126 by different power sources, or the fourth and sixth lower wirings 124 and 126 may be electrically connected so that the same voltage can be applied to them.

Therefore, since the voltage of the fifth lower wiring 125 connected to a gate electrode of the transistor in the $(k\_2)^{th}$ capacitor Ck_2 is different from the voltage of the fourth and sixth lower wirings 124 and 126 connected to the source/drain, a $k^{th}$ transistor capacitor Ck_MOS may be formed comprising part of the gate electrode.

Referring to FIG. 11B, a transistor in the $(k\_2)^{th}$ capacitor Ck_2 includes a gate MOS_G, a source/drain MOS_SD, a spacer MOS_spacer, and a high-k film MOS_HK, and. The same voltage is applied to the source/drain MOS_SD on both sides of the gate MOS_G, so that the $k^{th}$ transistor capacitor Ck_MOS includes the first gate-source/drain capacitor Ck_g/sd_1 and the second gate-source/drain capacitor Ck_g/sd_2. According to some embodiments, $k^{th}$ transistor capacitor Ck_MOS may include a capacitor in which the first gate-source/drain capacitor Ck_g/sd_1 and the second gate-source/drain capacitor Ck_g/sd_2 are connected in parallel.

Each of the first gate-source/drain capacitor Ck_g/sd_1 and the second gate-source/drain capacitor Ck_g/sd_2 may include a portion of the gate MOS_G and a portion of the source/drain MOS_SD. The first gate-source/drain capacitor Ck_g/sd_1 and the second gate-source/drain capacitor Ck_g/sd_2 may further include a spacer MOS_spacer and a high-k dielectric film MOS_HK as a dielectric, disposed between the gate MOS_G and the source/drain MOS_SD.

The structure illustrated in FIG. 11B may be referred to as a transistor/dielectric structure. The transistor/dielectric structure may be used in the peripheral logic layer PS. The transistor/logic structure may be used in either or both of the BR and NBR of the PS.

Thus, a transistor/dielectric structure may include a gate region, a source/drain region on both sides of the gate region, a spacer, and a dielectric film. The relative dielectric constant, k, of the film may be in the range of 6 to 14. A value of dielectric constant above 10 is considered to be a high dielectric constant.

In some embodiments, the transistor/dielectric structure is configured to provide a third capacitor ("capacitor 1") and a fourth capacitor ("capacitor 2") in parallel, the capacitor 1 and the capacitor 2 associated with opposite sides of the gate region, respectively. In FIG. 11B capacitor 1 is indicated as CK_g/sd_1 and capacitor 2 is indicated as CK_g/sd_2.

In addition, $k^{th}$ metal-insulator-metal (MIM) capacitors Ck_MIM1 and Ck_MIM2 having the peripheral logic insulating layer 110 as a dielectric may be formed comprising part of the fourth and sixth lower wirings 124 and 126 connected to the source/the drain and the fifth lower wiring 125 connected to the gate electrode. The $(k\_2)^{th}$ capacitor Ck_2 may include a capacitor in which the $k^{th}$ transistor capacitor Ck_MOS and the $k^{th}$ MIM capacitors Ck_MIM1 and Ck_MIM2 are connected in parallel.

The $(k+1\_1)^{th}$ diode Dk+1_1 and the $(k+1\_1)^{th}$ capacitor Ck+1_1 may be included in the non-buried region NBR of the semiconductor memory device 10 according to the embodiments.

The $(k+1\_1)^{th}$ diode Dk+1_1 is a diode using a transistor and may include the same structure and material as the $(k\_2)^{th}$ diode Dk_2. The $(k+1\_1)^{th}$ diode Dk+1_1 may be electrically connected to the sixth lower wiring 126 connected to the source/drain in the $(k\_2)^{th}$ capacitor Ck_2.

The $(k+1\_1)^{th}$ capacitor Ck+1_1 may include the first through third lower wirings 121 through 123 of the lower wiring 120, first through third through vias THV_PB1 through THV_PB3, and the first through third upper wirings 161 through 163 of the upper wiring structure 160.

The first and third lower wirings 121 and 123 connected to a source/drain of the transistor included in the $(k+1\_1)^{th}$ capacitor Ck+1_1 may be electrically connected to the first and third upper wirings 161 and 163, respectively. In addition, the second lower wiring 122 connected to a gate electrode of the transistor may be electrically connected to the second upper wiring 162.

Therefore, the first and third lower wirings 121 and 123 electrically connected to the source/drain of the transistor included in the $(k+1\_1)^{th}$ capacitor Ck+1_1 may be electrically connected to the first and third through vias THV_PB1 and THV_PB3, respectively, and the first and third through vias THV_PB1 and THV_PB3 may be electrically connected to the first and third upper wirings 161 and 163 through first and third through via connection wirings THV_PL1 and THV_PL3, respectively. The second lower wiring 122, the second through via THV_PB2, a second through via connection wiring THV_PL2, and the second upper wiring 162 are also electrically connected to each other.

Although not illustrated, the same voltage may be applied to the first lower wiring 121 and the third lower wiring 123 connected to the source/drain of the transistor included in the $(k+1\_1)^{th}$ capacitor Ck+1_1. Here, the same voltage may be applied to the first and third lower wirings 121 and 123 by different power sources, or the first and third lower wirings 121 and 123 may be electrically connected so that the same voltage can be applied to them Therefore, since the voltage of the second lower wiring 122 connected to the gate electrode of the transistor in the $(k+1\_1)^{th}$ capacitor Ck+1_1 is different from the voltage of the first and third lower wirings 121 and 123 connected to the source/drain, a $(k+1)^{th}$ transistor capacitor Ck+1_MOS may be formed comprising part of the gate electrode. The configuration of each $(k+1)^{th}$ transistor capacitor Ck+1_MOS may correspond to the configuration of each $(k)^{th}$ transistor capacitor Ck_MOS.

In addition, $(k+1)^{th}$ lower MIM capacitors Ck+_MIM1 and Ck+1_MIM2 having the peripheral logic insulating layer 110 as a dielectric may be formed comprising part of the first and third lower wirings 121 and 123 connected to the source/drain and the second lower wiring 122 connected to the gate electrode. $(K+1)^{th}$ through via capacitors Ck+1_THV1 and Ck+1_THV2 having the first interlayer insulating film 151 as a dielectric may be formed comprising part of the first and third through vias THV_PB1 and THV_PB3 and the second through via THV_PB2, and $(k+1)^{th}$ upper MIM capacitors Ck+1_MIM3 and Ck+1_MIM4 having the fourth interlayer insulating film 154 as a dielectric may be formed comprising part of the first and third upper wirings 161 and 163 and the second upper wiring 162. The $(k+1\_1)^{th}$ capacitor Ck+1_1 may include a capacitor in which the $(k+1)^{th}$ transistor capacitor Ck+1_MOS, the $(k+1)^{th}$ through via capacitors Ck+1_THV1 and Ck+1_THV2, and the $(t+1)^{th}$ lower and upper MIM capacitors Ck+1_MIM1, Ck+1_MIM2, Ck+1_MIM3 and Ck+1_MIM4 are connected in parallel.

Therefore, since the capacitor Ck+1_1 disposed in the non-buried region NBR additionally includes the through via capacitors Ck+1_THV1 and Ck+1_THV2 and the upper MIM capacitors Ck+1_MIM3 and Ck+1_MIM4 connected in parallel as compared with the capacitor Ck_2 disposed in the buried region BR, it may have greater capacitance for the same area.

Furthermore, the upper wiring structure 160 may be less affected by a process of the cell array structure CS including the stacked structure ST than the lower wiring structure 120. Therefore, the lower wiring structure 120 excluding the seventh lower wiring 127 connecting the $(k+1\_1)^{th}$ diode Dk+1_1 and the $(k+1\_1)^{th}$ capacitor Ck+1_1 may include a metal having better thermal durability but lower electrical conductivity than the upper wiring structure 160. Examples of the metal may include tungsten. The through vias THV_PB1 through THV_PB3 may also include a metal material having good thermal durability.

The upper wiring structure 160 including the first through third upper wirings 161 through 163 may include a metal having lower thermal durability but higher electrical conductivity than the lower wiring structure 120. Examples of the metal may include copper and aluminum.

Referring to FIG. 12, both ends of the $(k+1)^{th}$ upper MIM capacitors Ck+1+MIM3 and Ck+1+MIM4 are connected to conducting wires with high electrical conductivity, i.e., low resistance, including the first through third upper wirings 161 through 163. Therefore, the electrical conductivity of the $(k+2)^{th}$ capacitor Ck_2 may be higher than that of the $(k+1\_1)^{th}$ capacitor Ck+1_1.

The higher the electrical conductivity of a conducting wire, the higher the frequency that can be applied through the conducting wire. Therefore, a frequency applied to the $(k+2)^{th}$ capacitor Ck_2 may be higher than a frequency applied to the $(k+1\_1)^{th}$ capacitor Ck+1_1.

Therefore, referring to FIGS. 4A and 48, a frequency of the second clock signal of the second regulator Reg' connected to the $(k+1\_1)^{th}$ capacitor Ck+1_1 may be higher than a frequency of the first clock signal of the first regulator Reg.

As the frequency applied to the capacitor increases, the impedance of the capacitor decreases. Accordingly, the amount of charge provided to the row decoder 33 of FIG. 1 through the capacitor increases. Thus, the $(k+1)^{th}$ capacitor Ck+1_1 may provide a greater amount of charge to a word line than the $(k\_2)^{th}$ capacitor Ck_2 for the same area.

Figure 13:
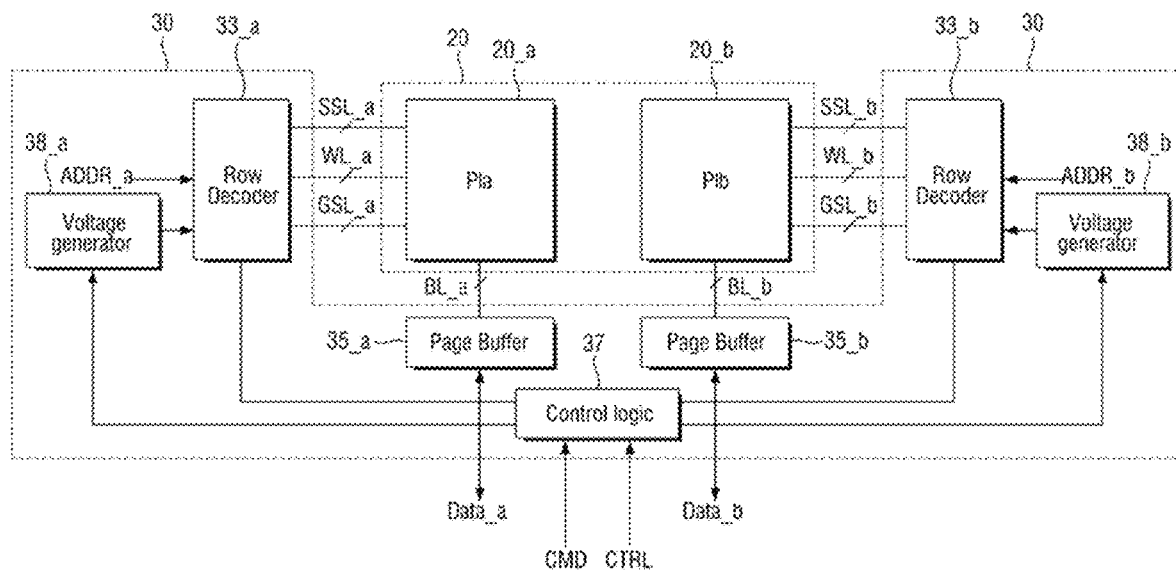
FIG. 13 is a block diagram of a semiconductor memory device according to some embodiments.

FIG. 13 is a block diagram of a semiconductor memory device 10 according to embodiments. Compared with the embodiment of FIG. 1, the memory device 10 of FIG. 13 may include a plurality of memory cell arrays 20_a and 20_b and a plurality of row decoders 33_a and 33_b and a plurality of page buffers 35a and 35_b corresponding to the memory cell arrays and 20_b. A peripheral circuit 30 may refer to elements included in the memory device 10 including the row decoders 33_a and 33_b and the page buffers 35_a and 35_b. Referring to FIG. 13, the memory device 10 may include a plurality of plane memory cell arrays PLa and PLb 20a and 20b controlled independently. Word lines of the plane memory cell arrays 20_a and 20_b may be activated independently by the row decoders 33_a and 33_b and a plurality of voltage generators 38_a and 38_b, respectively, and operations (e.g., write operations and read operations) of the plane memory cell arrays 20_a and 20_b may be controlled independently through the page buffers 35_a and 35_b, respectively.

As described above, in the memory device 10, units of memory cell arrays that are controlled independently of each other to perform a specific operation in parallel or perform different operations may be referred to as planes. In the example of FIG. 13, the memory cell array 20_a and the memory cell array 20_b may be referred to as being included in different planes, respectively.

Referring to FIG. 13, the peripheral circuit 30 may receive a command CMD and a control signal CTRL from outside the memory device 10 through a common control logic 37 and separately provide address signals ADDR_a and ADDR_b respectively corresponding to plane a PLa and plane b PLb to the row decoders 33_a and 33_b. The page buffers 35_a and 35_b respectively corresponding to plane a PLa and plane b PLb may perform operations regarding corresponding data Data_a and Data_b.

Although plane c PLc and plane d PLd are not illustrated, it is obvious that the description of plane a PLa and plane b PLb and elements respectively corresponding to plane a PLa and plane b PLb will be applied to plane c PLc and plane d PLd and elements respectively corresponding to plane c PLc and plane d PLd.

Figure 14:
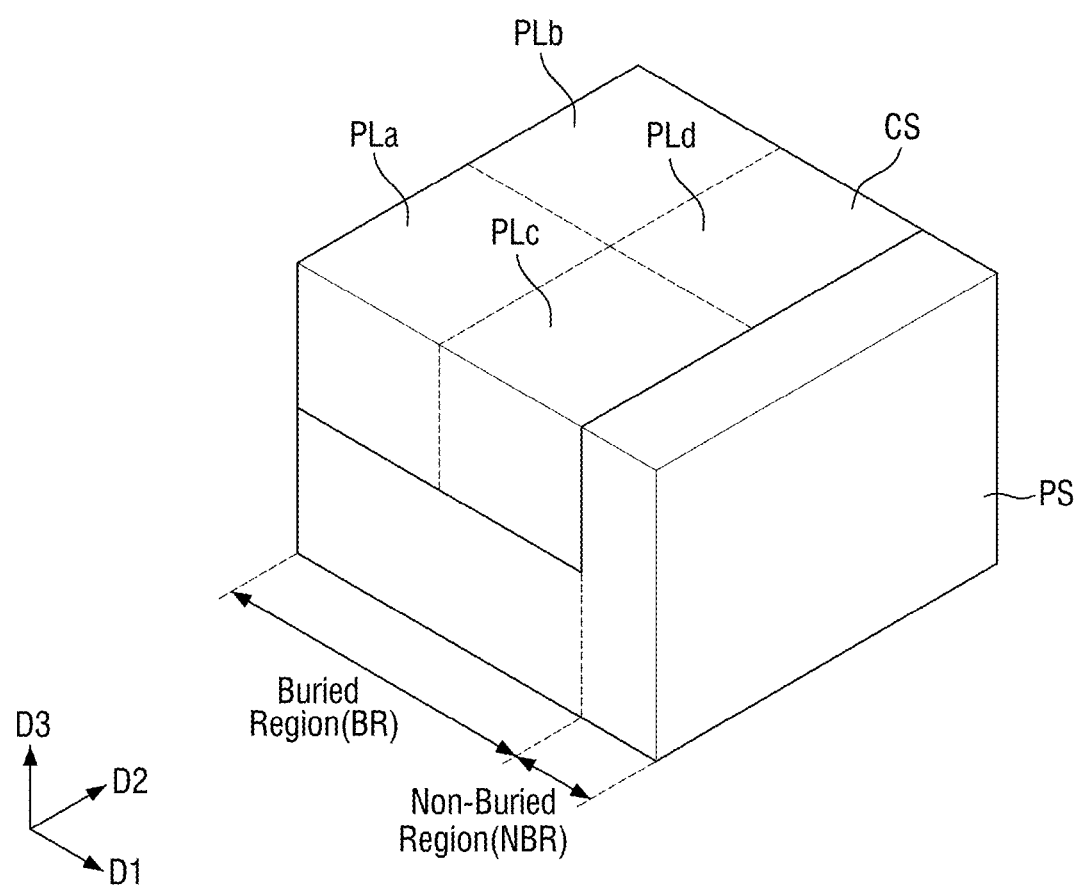
FIG. 14 is a schematic perspective view of the semiconductor memory device according to some embodiments.
Figure 15:
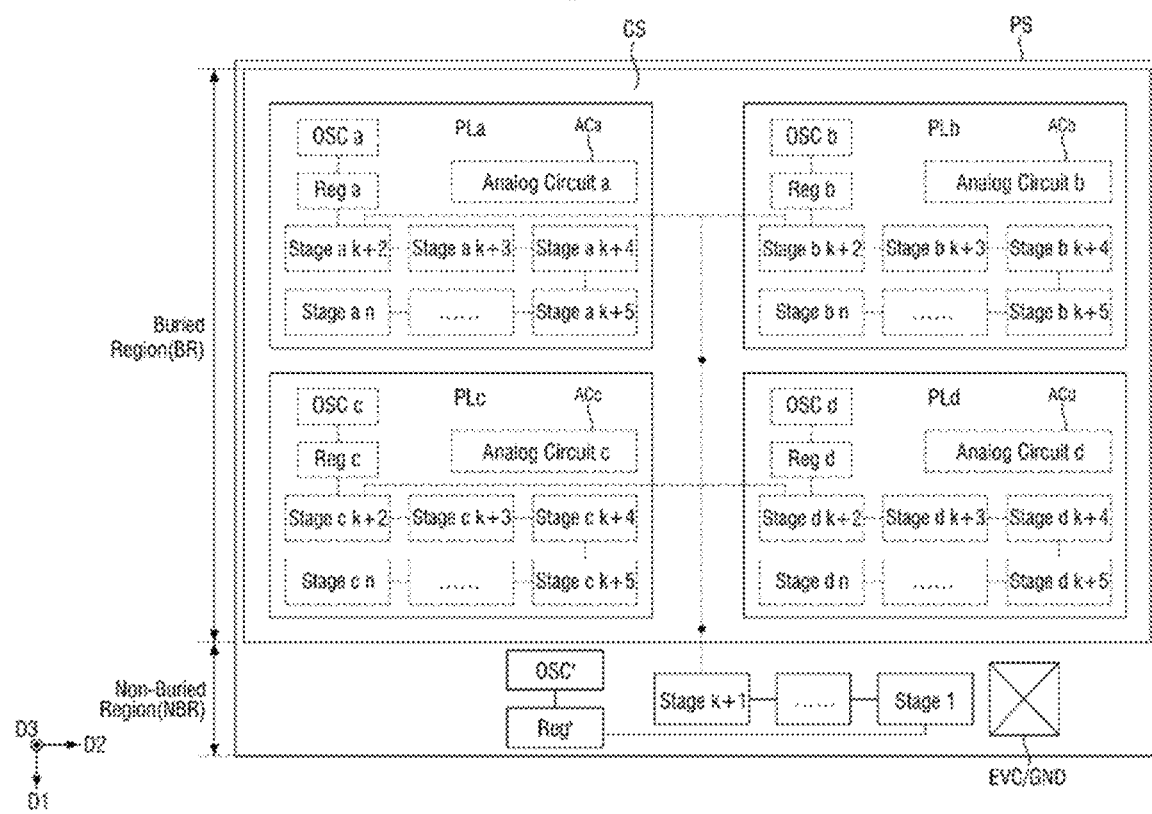
FIG. 15 is a plan block diagram of a peripheral logic structure included in the semiconductor memory device according to some embodiments.

FIG. 14 is a schematic perspective view of the semiconductor memory device 10 according to the embodiments. FIG. 15 is a plan block diagram of a peripheral logic structure PS included in the semiconductor memory device 10 according to the embodiments.

Referring to FIGS. 14 and 15, a cell array structure CS may include a plurality of planes PLa through PLd as compared with the previous embodiments.

A buried region BR of the peripheral logic structure PS will now be described, focusing mainly on elements disposed under plane a PLa. It is obvious that the description of the elements disposed under plane a PLa is applied to elements corresponding to the other planes b, c and d PLb, PLc and PLd.

Compared with the embodiment of FIG. 6, the peripheral logic structure PS may include oscillator a OSC_a, regulator a Reg_a, $(k+2)^{th}$ through $n^{th}$ amplification stages a Stage_a k+2 through Stage_a n, and analog circuit a ACa under plane a PLA. These elements may correspond to the first oscillator OSC, the first regulator Reg, the first through $k^{th}$ amplification stages Stage 1 through Stage k, and the analog circuit AC in FIGS. 4A and 4B, respectively. However, unlike in FIGS. 4A and 4B, $(k+2)^{th}$ amplification stage a Stage_a k+2 may receive an output current of a non-buried region NBR, and $n^{th}$ amplification stage a Stage_a n may provide the current to the row decoder 33_a of plane a PLa.

In the non-buried region NBR of the peripheral logic structure PS, a common oscillator OSC', a common regulator Reg', first through $(k+1)^{th}$ common amplification stages Stage 1 through Stage k+1, and a common external voltage contact or ground pad EVC/GND respectively correspond to the elements of the non-buried region NBR of the previous embodiments. However, the non-buried region NBR of the peripheral logic structure PS is different from that of the previous embodiments in that an output of the $(k+1)^{th}$ common amplification stage k+1 is input to respective $(k+2)^{th}$ stages Stage_a k+2, Stage_b k+2, Stage_c k+2 and Stage_d k+2 of the planes PLa, PLb, PLc and PLd.

In the embodiments of FIG. 15 as compared with the embodiments of FIG. 6, the $(k+2)^{th}$ stages Stage_a k+2, Stage_b k+2, Stage_c k+2 and Stage_d k+2 respectively disposed under the planes PLa, PLb, PLc and PLd may be connected in series to the $(k+1)^{th}$ common stage k+1.

The number of the planes PLa through PLd and the connection relationship are not limited to those illustrated in FIG. 15.

However, the effects of the embodiments are not restricted to the one set forth herein. The above and other effects of the embodiments will become more apparent to one of daily skill in the art to which the present disclosure pertains by referencing the claims.

What is claimed is:

1. A semiconductor memory device comprising:
a cell array structure;
a peripheral logic structure comprising a first region comprising a first region of a substrate and a second region comprising a second region of the substrate, wherein the first region of the peripheral logic structure is disposed directly below the cell array structure;
first lower wirings disposed in the first region of the substrate;
second lower wirings disposed in the second region of the substrate;
a stacked structure, wherein the stacked structure is disposed on the first lower wirings, and the stacked structure comprises an interlayer insulating film and an electrode pad alternately stacked in a direction perpendicular to the substrate;
a vertical structure penetrating the stacked structure;
a tunnel insulating layer extending along sidewalls of the vertical structure;
a charge storage layer extending along sidewalls of the tunnel insulating layer;
a plurality of through vias disposed on the second lower wirings and disposed in the second region of peripheral logic structure, wherein the plurality of through vias are configured to electrically connect the second lower wirings and upper wirings, wherein the upper wirings are disposed in the second region of the peripheral logic structure;
a first amplification stage comprising the first lower wirings and configured to generate a first operating voltage to be applied to the electrode pad; and
a second amplification stage comprising the second lower wirings and the plurality of through vias, electrically connected to the first amplification stage, and configured to generate a second operating voltage to be applied to the electrode pad,
wherein the second region of the peripheral logic structure comprises a metal-insulator-metal (MIM) capacitor disposed above the plurality of through vias.

2. The semiconductor memory device of claim 1, wherein
the first amplification stage is disposed in the first region of the substrate and the second amplification stage is disposed in the second region of the substrate,
the first amplification stage comprises a first transistor/dielectric structure in the first region of the substrate,
the second amplification stage comprises a second transistor/dielectric structure in the second region of the substrate,
a diode of the second transistor/dielectric structure is not directly below the second lower wirings, and
a transistor capacitor formed comprising part of a gate electrode of the second amplification stage is directly below the second lower wirings.

3. The semiconductor memory device of claim 1, wherein
the first amplification stage is configured to receive a first clock signal from a first regulator,
the first clock signal is based on a first oscillator output,
the first oscillator output is based on a first feedback voltage from a first node of the first amplification stage or from a second of the second amplification stage,
the second amplification stage is configured to receive a second clock signal from a second regulator, the second clock signal is based on a second oscillator output, and the second oscillator output is based on a second feedback voltage from a word line of the cell array structure.

4. A semiconductor memory device comprising:
a substrate comprising a first region and a second region;
first lower wirings disposed in the first region of the substrate;
second lower wirings disposed in the second region of the substrate;
a stacked structure, wherein the stacked structure is disposed on the first lower wirings, and the stacked structure comprises an interlayer insulating film and an electrode pad alternately stacked in a direction perpendicular to the substrate;
a vertical structure penetrating the stacked structure;
a tunnel insulating layer extending along sidewalls of the vertical structure;
a charge storage layer extending along sidewalls of the tunnel insulating layer;
a plurality of through vias disposed on the second lower wirings, wherein the plurality of through vias are configured to electrically connect the second lower wirings and upper wirings, wherein the upper wirings are disposed on the plurality of through vias;
a first amplification stage comprising the first lower wirings and configured to generate a first operating voltage to be applied to the electrode pad; and
a second amplification stage comprising the second lower wirings and the plurality of through vias, electrically connected to the first amplification stage, and configured to generate a second operating voltage to be applied to the electrode pad,
wherein the first region comprises a first transistor electrically connected to the first lower wirings,
a first transistor capacitor implemented by the first transistor and a first metal-insulator-metal (MIM) capacitor comprising a first part of the first lower wirings,
the second region comprises a second transistor electrically connected to the second lower wirings,
a second transistor capacitor implemented by the second transistor and a second MIM capacitor comprising a second part of the second lower wirings, and
a through via capacitor comprising a third part of the plurality of through vias.

5. The semiconductor memory device of claim 4, further comprising a third MIM capacitor implemented by a fourth part of the upper wirings.

6. The semiconductor memory device of claim 5, comprising:
a first capacitor comprising the first transistor capacitor and the first MIM capacitor connected in parallel; and
a second capacitor comprising the second transistor capacitor, the second MIM capacitor, the through via capacitor, and the third MIM capacitor connected in parallel.

7. The semiconductor memory device of claim 1, wherein the first lower wirings and the upper wirings are made of different materials.

8. The semiconductor memory device of claim 7, wherein the first region of the substrate further comprises a first regulator, wherein the first regulator is configured to:
drive the first amplification stage, and
generate a first clock signal, and
the second region of the substrate further comprises a second regulator, wherein the second regulator is configured to:
drive the second amplification stage, and
generate a second clock signal having a frequency different from that of the first clock signal.

9. The semiconductor memory device of claim 8, wherein a second frequency of the second clock signal is higher than a first frequency of the first clock signal.

10. The semiconductor memory device of claim 7, wherein the first region of the substrate further comprises a first regulator, wherein the first regulator is configured to:
drive the first amplification stage, and
generate a first clock signal, and
the second region of the substrate further comprises a second regulator, wherein the second regulator is configured to:
drive the second amplification stage, and
generate a second clock signal having a second frequency different from a first frequency of the first clock signal.

11. The semiconductor memory device of claim 1, further comprising an analog circuit in the first region of the substrate, wherein the analog circuit electrically connected to the stacked structure.

12. The semiconductor memory device of claim 1,
wherein the second region of the substrate further comprises an external voltage contact, and
a first distance between the external voltage contact and the first amplification stage is greater than a second distance between the external voltage contact and the second amplification stage.

13. The semiconductor memory device of claim 1,
wherein the second region of the substrate further comprises a ground pad, and
a third distance between the ground pad and the first amplification stage is greater than a fourth distance between the ground pad and the second amplification stage.

14. A semiconductor memory device comprising:
a memory cell array electrically connected to a plurality of word lines and electrically connected to a plurality of bit lines, the memory cell array comprising a plurality of memory cells stacked vertically from a substrate, wherein the plurality of memory cells comprise a first plane memory cell and a second plane memory cell disposed on the substrate not to vertically overlap each other;
a first amplification stage disposed under and vertically overlapped by the first plane memory cell, wherein the first amplification stage is configured to generate a first operating voltage to be applied to the plurality of word lines so as to operate the first plane memory cell;
a second amplification stage disposed under and vertically overlapped by the second plane memory cell, wherein the first amplification stage is configured to generate a second operating voltage to be applied to the plurality of word lines so as to operate the second plane memory cell; and
a common amplification stage which is disposed under but is not overlapped by the memory cell array, is disposed on the substrate, wherein the common amplification stage is configured to generate a third operating voltage to be applied to the plurality of word lines so as to operate the first plane memory cell and the second plane memory cell,
wherein the first amplification stage comprises first lower wirings electrically connected to the memory cell array,
the second amplification stage comprises second lower wirings electrically connected to the memory cell array, the common amplification stage comprises common lower wirings electrically connected to the memory cell array and a plurality of through vias electrically connecting the common lower wirings and upper wirings disposed higher than the memory cell array, and the common amplification stage is connected in series to each of the first amplification stage and the second amplification stage.

15. The semiconductor memory device of claim 14,
wherein the first amplification stage further comprises a first transistor electrically connected to the first lower wirings, a first transistor capacitor implemented by the first transistor and a first lower MIM capacitor comprising a first part of the first lower wirings, the second amplification stage further comprises a second transistor electrically connected to the second lower wirings, a second transistor capacitor implemented by the second transistor and a second lower MIM capacitor comprising a second part of the second lower wirings, and the common amplification stage further comprises a third transistor electrically connected to the common lower wirings, a third transistor capacitor implemented by the third transistor and a third lower MIM capacitor comprising a third part of the common lower wirings, a through via capacitor formed between the plurality of through vias and an upper MIM capacitor comprising a fourth part of the upper wirings.

16. The semiconductor memory device of claim 15, comprising:
a first capacitor comprising the first transistor capacitor and the first lower MIM capacitor connected in parallel;
a second capacitor comprising the second transistor capacitor and the second lower MIM capacitor connected in parallel; and
a common capacitor in which the third transistor capacitor, the third lower MIM capacitor, the through via capacitor and the upper MIM capacitor are connected in parallel.

17. The semiconductor memory device of claim 15,
wherein the first amplification stage is driven by a first regulator, wherein the first regulator is configured to generate a first clock signal, the second amplification stage is driven by a second regulator, wherein the second regulator is configured to generate a second clock signal, and the common amplification stage is driven by a common regulator, wherein the common regulator is configured to generate a common clock signal having a third frequency faster than each of the first clock signal and the second clock signal.

* * * * *